United States Patent
Takahashi

(10) Patent No.: US 7,947,106 B2
(45) Date of Patent: May 24, 2011

(54) SB-TE ALLOY POWDER FOR SINTERING, SINTERED COMPACT SPUTTERING TARGET OBTAINED BY SINTERING SAID POWDER, AND MANUFACTURING METHOD OF SB-TE ALLOY POWDER FOR SINTERING

(75) Inventor: Hideyuki Takahashi, Ibaraki (JP)

(73) Assignee: JX Nippon Mining & Metals Corporation, Tokyo (JP)

( * ) Notice: Subject to any disclaimer, the term of this patent is extended or adjusted under 35 U.S.C. 154(b) by 985 days.

(21) Appl. No.: 11/813,694

(22) PCT Filed: Nov. 29, 2005

(86) PCT No.: PCT/JP2005/021851
§ 371 (c)(1),
(2), (4) Date: Jul. 11, 2007

(87) PCT Pub. No.: WO2006/077692
PCT Pub. Date: Jul. 27, 2006

(65) Prior Publication Data
US 2009/0071821 A1 Mar. 19, 2009

(30) Foreign Application Priority Data
Jan. 18, 2005 (JP) .................................. 2005-009784

(51) Int. Cl.
*B22F 1/00* (2006.01)
*C23C 14/32* (2006.01)

(52) U.S. Cl. .......... 75/255; 75/228; 75/338; 204/298.13
(58) Field of Classification Search .................... 75/255, 75/228, 338; 204/298.13
See application file for complete search history.

(56) References Cited

U.S. PATENT DOCUMENTS

| | | | |
|---|---|---|---|
| 7,156,964 B2 | 1/2007 | Yahagi et al. | |
| 2003/0168333 A1* | 9/2003 | Schlott et al. | 204/192.13 |
| 2007/0062808 A1 | 3/2007 | Yahagi et al. | |
| 2007/0297938 A1 | 12/2007 | Takahashi | |

FOREIGN PATENT DOCUMENTS

| | | |
|---|---|---|
| EP | 1394284 A1 | 3/2004 |
| JP | 03-162570 A | 7/1991 |
| JP | 2001-342505 A | 12/2001 |
| JP | 2001-342559 A | 12/2001 |
| JP | 2004-162109 A | 6/2004 |

OTHER PUBLICATIONS

ESP@CENET Database, English Abstract of JP 2000-265262, Sep. 26, 2000.
ESP@CENET Database, English Abstract of JP 2001-098366, Apr. 10, 2001.
ESP@CENET Database, English Abstract of JP 2001-123266, May 8, 2001.
ESP@CENET Database, English Abstract of JP 10-081962, Mar. 31, 1998.
ESP@CENET Database, English Abstract of JP 2001-123267, May 8, 2001.
ESP@CENET Database, English Abstract of JP 2000-129316, May 9, 2000.

* cited by examiner

*Primary Examiner* — Roy King
*Assistant Examiner* — Ngoclan T Mai
(74) *Attorney, Agent, or Firm* — Howson & Howson LLP

(57) ABSTRACT

Provided is Sb—Te alloy powder for sintering in which the maximum grain size of the powder obtained by subjecting gas atomized powder of an Sb—Te alloy to mechanical pulverization is 90 μm or less, and a sintered compact sputtering target obtained by sintering this powder. Further provided is a manufacturing method of Sb—Te alloy powder for a sintered compact sputtering target including the steps of dissolving an Sb—Te alloy, thereafter subjecting this to gas atomization to obtain atomized powder, and further subjecting this to mechanical pulverization in an inert atmosphere without any atmospheric exposure so as to manufacture powder having a maximum grain size of 90 μm or less and reduced oxygen content. Thus, the Sb—Te alloy sputtering target structure can be uniformalized and refined, generation of cracks in the sintered target can be inhibited, and generation of arcing during sputtering can be inhibited. Further, surface ruggedness caused by sputter erosion can be reduced in order to obtain a high quality Sb—Te alloy sputtering target.

20 Claims, 1 Drawing Sheet

SB-TE ALLOY POWDER FOR SINTERING, SINTERED COMPACT SPUTTERING TARGET OBTAINED BY SINTERING SAID POWDER, AND MANUFACTURING METHOD OF SB-TE ALLOY POWDER FOR SINTERING

BACKGROUND OF THE INVENTION

The present invention generally relates to Sb—Te alloy powder for sintering, and in particular relates to Sb—Te alloy powder for sintering suitable in manufacturing an Sb—Te alloy sputtering target for forming a phase-change recording layer comprising an Ag—In—Sb—Te alloy or a Ge—Sb—Te alloy, a sintered compact sputtering target obtained by sintering this powder, and a manufacturing method of the Sb—Te alloy powder for sintering.

In recent years, a thin film formed from an Sb—Te material as the phase-change recording material is being used as a medium for recording information using so-called phase transformation. As a method of forming a thin film formed from an Sb—Te alloy material, a generally employed means known as a physical deposition method such as a vacuum deposition method or a sputtering method is used. In particular, a magnetron sputtering method is often used for forming such a thin film from the perspective of operability and coating stability.

Formation of a film according to the sputtering method is conducted by physically colliding positive ions such as Ar ions to a target disposed on a negative electrode, discharging the material configuring the target with such collision energy, and laminating a film having approximately the same composition as the target material on a substrate on the opposite positive electrode side.

Coating according to the sputtering method is characterized in that it is able to form thin films of angstrom units and thick films of several ten µm with a stable deposition speed by adjusting the treating time and power supply.

A particular problem when forming a film formed with an Sb—Te alloy material for a phase-change recording film is the generation of particles during sputtering, generation of nodules (protrusions) that causes abnormal electrical discharge (micro arcing) or cluster-shaped thin films (films that get adhered as a cluster), generation of cracks or fractures of targets during sputtering, and absorption of large quantities of oxygen during the manufacturing process of sintering powder for targets.

The foregoing problems concerning the target or sputtering process are significant cause in deteriorating the quality of the thin film as the recording medium.

It is known that the foregoing problems are significantly influenced by the grain size of the sintering powder or the structure and quality of the target. Nevertheless, conventionally, since it was not possible to manufacture an appropriate amount of powder upon manufacturing an Sb—Te alloy sputtering target for forming a phase-change recording layer, and because the target obtained by sintering did not posses sufficient characteristics, it was not possible to avoid the generation of particles, abnormal electrical discharge, generation of nodules, and generation of cracks or fractures of the target during sputtering, or the inclusion of a large quantity of oxygen in the target.

As a conventional manufacturing method of a Ge—Sb—Te sputtering target, disclosed is a manufacturing method of a Ge—Sb—Te sputtering target including the steps of preparing powder by performing inert gas atomization to a Ge—Te alloy and an Sb—Te alloy, uniformly mixing the alloys having a ratio of Ge/Te=1/1 and Sb/Te=0.5 to 2.0, and thereafter performing pressure sintering thereto (for instance, refer to Patent Document 1).

Further, disclosed is a manufacturing method of a Ge—Sb—Te sputtering target and technology for manufacturing powder to be used therein employing the atomization method, including the steps of casting powder among the alloy powder containing Ge, Sb, Te in which the tap density (relative density) is 50% or greater into a mold, performing cold or hot pressurization thereto, and sintering the molding material in which the density after cold pressurization is 95% or greater through heat treatment in an Ar or vacuum atmosphere so as to make the oxygen content in the sintered compact 700 ppm or less (for instance, refer to Patent Document 2).

Further, disclosed is a manufacturing method of a Ge—Sb—Te sputtering target material including the steps of preparing rapidly-cooled powder by the inert gas atomization method from a raw material containing Ge, Sb, Te, and sintering a compact subject to cold or hot pressure forming using powder among said powder that is 20 µm or greater and having a particle size distribution where the specific surface area per unit weight is 300 mm$^2$/g or less (for instance, refer to Patent Document 3).

Other technologies for manufacturing targets using atomized powder are described in Patent Documents 4, 5, 6 indicated below.

Nevertheless, since the foregoing Patent Documents use the atomized powder as is, they are not able to obtain sufficient target strength, and it can hardly be said that they have achieved the refinement and homogenization of the target structure. Further, the tolerated oxygen content is high, and there is a problem in that the foregoing technologies are insufficient as an Sb—Te sputtering target for forming a phase-change recording layer.

[Patent Document 1] Japanese Patent Laid-Open Publication No. 2000-265262
[Patent Document 2] Japanese Patent Laid-Open Publication No. 2001-98366
[Patent Document 3] Japanese Patent Laid-Open Publication No. 2001-123266
[Patent Document 4] Japanese Patent Laid-Open Publication No. S10-81962
[Patent Document 5] Japanese Patent Laid-Open Publication No. 2001-123267
[Patent Document 6] Japanese Patent Laid-Open Publication No. 2000-129316

SUMMARY OF THE INVENTION

The present invention was devised in order to overcome the foregoing problems. Thus, an object of the present invention is to provide an Sb—Te alloy powder for target sintering capable of effectively inhibiting the generation of particles, abnormal electrical discharge, general of nodules, and generation of cracks or fractures of the target during sputtering, and reducing the oxygen contained in the target. In particular, the present invention provides an Sb—Te alloy powder for sintering suitable in manufacturing an Sb—Te alloy sputtering target for forming a phase-change recording layer comprising an Ag—In—Sb—Te alloy or a Ge—Sb—Te alloy, a sintered compact sputtering target obtained by sintering this powder, and a manufacturing method of the Sb—Te alloy powder for sintering.

The present inventors discovered that a technical means for overcoming the foregoing problems is in the devisal of powder quality and target structure and characteristics in order to obtain a stable and homogenous phase-change recording layer.

Based on the foregoing discovery, the present invention provides:

1. Sb—Te alloy powder for sintering and a sintered compact sputtering target obtained by sintering the powder, wherein the maximum grain size of the powder excluding tabular coarse particles obtained by additionally subjecting gas atomized powder of an Sb—Te alloy to mechanical pulverization is 90 μm or less;
2. The Sb—Te alloy powder for sintering and the sintered compact sputtering target obtained by sintering the powder according to paragraph 1 above, wherein the oxygen concentration after mechanical pulverization is 1500 wtppm or less;
3. The Sb—Te alloy powder for sintering and the sintered compact sputtering target obtained by sintering the powder according to paragraph 1 above, wherein the oxygen concentration after mechanical pulverization is 1000 wtppm or less; and
4. The Sb—Te alloy powder for sintering and the sintered compact sputtering target obtained by sintering the powder according to paragraph 1 above, wherein the oxygen concentration after mechanical pulverization is 500 wtppm or less.

The present invention further provides:

5. Sb—Te alloy powder for sintering and a sintered compact sputtering target obtained by sintering the powder, wherein the amount of tabular particles formed by adhesion, compression or rolling with a pulverization jig upon the mechanical pulverization of powder is 10% or less of the overall amount of the powder;
6. The Sb—Te alloy powder for sintering and the sintered compact sputtering target obtained by sintering the powder according to any one of paragraphs 1 to 4 above, wherein the amount of tabular particles formed by adhesion, compression or rolling with a pulverization jig upon the mechanical pulverization of powder is 10% or less of the overall amount of the powder;
7. The Sb—Te alloy powder for sintering and the sintered compact sputtering target obtained by sintering the powder according to any one of paragraphs 1 to 6 above containing one or more elements selected from Ag, In, Ge, Ga, Ti, Au, Pt and Pd at 25 at % or less; and
8. A Sb—Te alloy sputtering target, wherein the surface roughness Ra of the eroded surface after sputtering using the Sb—Te alloy sintered compact sputtering target according to any one of paragraphs 1 to 7 above is 0.5 μm or less.

The present invention additionally provides:

9. A manufacturing method of Sb—Te alloy powder for a sintered compact sputtering target according to any one of paragraphs 1 to 8 above, including the steps of dissolving an Sb—Te alloy, thereafter subjecting this to gas atomization to obtain atomized powder, and further subjecting this to mechanical pulverization in an inert atmosphere without any atmospheric exposure.

Incidentally, so as long as there is no known art regarding the conditions of paragraphs 1 to 9 above, it should be understood that each independent condition of paragraphs 1, 5 and 8 above alone sufficiently satisfies the conditions as an invention. The dependent conditions; that is, paragraphs 2, 3, 4, 6, 7 and 9 above are respectively conditions that are preferably incidental to the foregoing independent conditions. These dependent conditions also constitute a new invention by being combined with the conditions of paragraphs 1, 5 and 8 above.

As described above, as a result of using powder in which the maximum grain size of the powder obtained by additionally subjecting gas atomized powder of an Sb—Te alloy to mechanical pulverization is 90 μm or less, a superior effect is yielded in that the Sb—Te alloy sputtering target structure becomes uniform and refined, generation of cracks in the sintered target is prevented, and generation of arcing during sputtering is inhibited. Further, an additional effect is yielded in that the surface ruggedness caused by sputter erosion is reduced, and generation of particles caused by re-deposition peeling onto the target surface is reduced.

Like this, by refining and homogenizing the target structure, it is possible to inhibit the in-plane and lot-to-lot compositional variability of the manufactured thin film, and the quality of the phase-change recording layer will become stable. Further, it is possible to reduce the generation of nodules caused by the difference in the sputtering rate, and consequently inhibit the generation of particles.

By performing gas atomization in a vacuum or inert gas atmosphere and further implementing mechanical pulverization in an inert gas atmosphere, a significant effect is yielded in that it is possible to obtain a material of low oxygen concentration. Moreover, the Sb—Te sputtering target sintered compact according to the present invention possesses extremely superior characteristics of having high strength where the transverse rupture strength is 60 MPa or greater, and preventing the generation of cracks or fractures during sputtering.

DETAILED DESCRIPTION OF THE INVENTION

Figure 1:
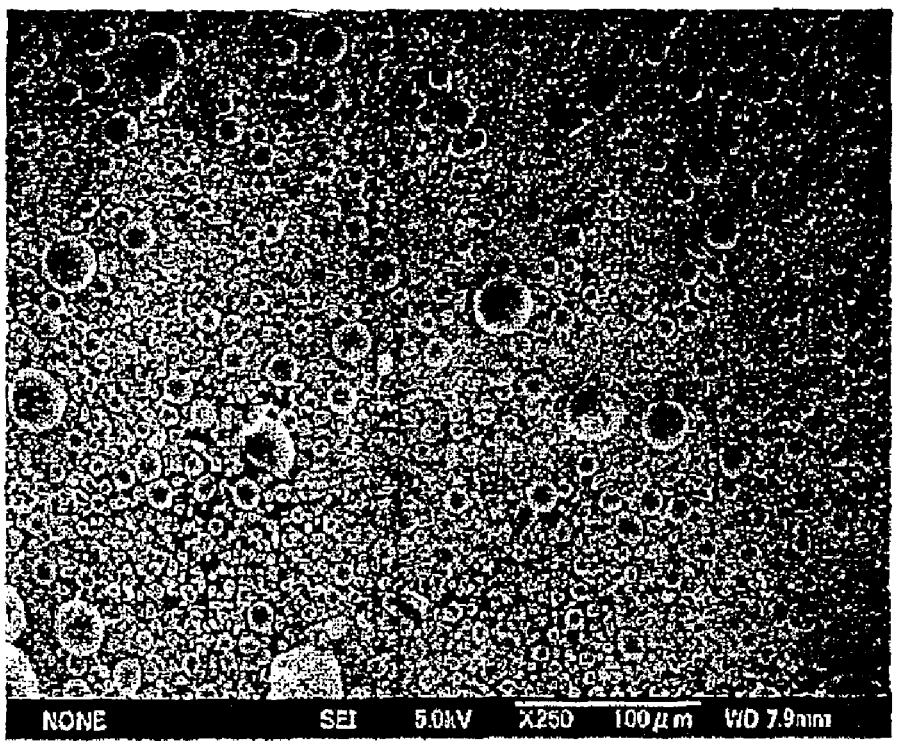
FIG. 1 is an SEM photo (image) of powder after additionally subjecting the gas atomized powder of the $Ge_{22.2}Sb_{22.2}Te_{55.6}$ (at %) alloy raw material of Example 1 to mechanical pulverization.
Figure 2:
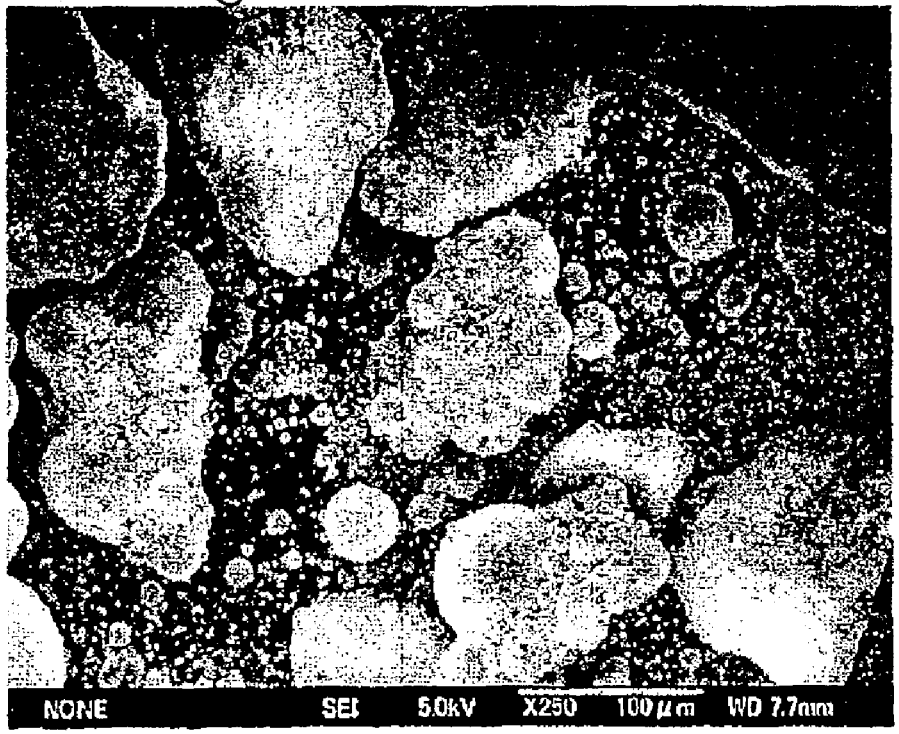
FIG. 2 is an SEM photo (image) of powder after additionally subjecting the gas atomized powder of the $Ge_{22.2}Sb_{22.2}Te_{55.6}$ (at %) alloy raw material of Comparative Example 2 to mechanical pulverization.

The present invention relates to Sb—Te alloy powder for sintering and a sintered compact sputtering target obtained by sintering the powder, wherein the maximum grain size of the powder obtained by additionally subjecting gas atomized powder of an Sb—Te alloy to mechanical pulverization is 90 μm or less.

Normally, in an Sb—Te alloy target, an Sn—Te alloy containing 10 to 90 at % of Sb, in particular 20 to 80 at % of Sb is used. Nevertheless, it goes without saying that the present invention is not limited to the foregoing component range, and may be applied outside such component range.

Generally speaking, with gas atomized powder, it is possible to obtain powder that is much finer than mechanical powder. In addition, since it is possible to prevent contamination caused by the use of a pulverizer, gas atomized powder is directly used as sintering powder.

Nevertheless, in reality, gas atomized powder has variations in its grain size, and some grains have a diameter greater than 100 μm. It has been discovered that these coarse particles cause cracks in the sintered compact during the sintering process. Further, when sputtering is performed using this kind of target, arcing is easily generated. Under these circumstances, as the most preferable means for making the grain size uniform, classification was considered. Nevertheless, since the yield of raw material is inferior with classification, it has become known that classification is not necessary the best plan.

In light of the above, the present inventors devised methods for obtaining atomized powder having the optimal particle size distribution, and it has been discovered that the implementation of mechanical pulverization after the atomization process, which was originally considered to be regression of technology, is extremely effective.

Accordingly, in the present invention, after dissolving the Sb—Te alloy, gas atomization is performed to obtain atomized powder, and this is further subject to mechanical pulverization. In order to manufacture powder with reduced oxygen content, it is desirable to perform mechanical pulverization in an inert atmosphere without any exposure to the atmosphere. A vibratory ball mill or the like may be used for mechanical pulverization. Further, inert gas may be used as the atmosphere for mechanical pulverization.

Thereby, it is possible to manufacture powder in which the maximum grain size is 90 µm or less, and with reduced oxygen content.

Preferably, the maximum grain size of the machine-pulverized powder is made to be 45 µm or less. It is thereby possible to effectively inhibit the generation of cracks in the sintered compact.

Further, in order to prevent the mixture of oxygen, it is desirable to prevent the infiltration of air, and make the oxygen concentration after mechanical pulverization 1500 wtppm or less, preferably make the oxygen concentration after mechanical pulverization 1000 wtppm or less, and more preferably make the oxygen concentration after mechanical pulverization 500 wtppm or less. As a result, it is possible to reduce the generation of oxides that arise due to the mixture of oxygen; that is, oxides of Sb or Te, and further reduce the generation of oxides composed of one or more elements selected from Ag, In, Ge, Ga, Ti, Au, Pt and Pd, which are additive elements described later, and thereby inhibit the generation of arcing caused by these oxides.

Generally speaking, since an Sb—Te alloy has high viscosity, a large quantity thereof adheres to a pulverization jig upon mechanical pulverization, and a phenomenon of the powders contacting each other and the powder particles being rolled will occur. Therefore, when pulverization is performed for a long time, there is a problem in that flat (tabular) particles will be formed simultaneously with the formation of fine powder having a grain size of 1 µm or less.

Incidentally, in this Description, particles in which the ratio of short axis to long axis is 1:10 or greater are defined as being tabular for the sake of convenience. Since these particles are coarse, these are classified as being different from the pulverized powder. The tabular particles have a large grain shape and cause unevenness of the particles and, therefore, cannot be used for manufacturing a sintered compact, and also deteriorate the raw material yield.

In order to prevent the generation of arcing or cracks in the sintered compact, it is desirable that the amount of tabular particles generated from mechanical pulverization is 10% or less of the overall amount of the powder.

In order to prevent the generation of such flat (tabular) particles, it is desirable to perform mechanical pulverization under a condition where coarse particles of 50 µm or greater are selectively pulverized.

In this state, particles that are less than 50 µm will hardly be pulverized and remain spherical, and this is preferable since it will be difficult for such spherical particles to become oxidized. In addition, it is desirable to discontinue mechanical pulverization in a state where the amount of tabular particles generated from mechanical pulverization becomes 10% or less of the overall amount of the powder.

The Sb—Te alloy powder for sintering and the sintered compact sputtering target obtained by sintering the foregoing powder according to the present invention may contain, as an additive element, one or more elements selected from Ag, In, Ge, Ga, Ti, Au, Pt and Pd at 25 at % or less. It is thereby possible to obtain an Sb—Te alloy sintered compact sputtering target of high strength and fine crystal grains. The foregoing 25 at % or less is a numerical value that shows preferable conditions, and it should be understood that the present invention is not limited to the foregoing numerical value as the amount of additive element. Needless to say, the additive element may be added under conditions outside the foregoing numerical value, and the present invention also covers such conditions.

Generally speaking, the eroded surface after sputtering becomes a rough surface where the surface roughness Ra is 1 µm or greater, and tends to become coarser together with the progress of sputtering. Nevertheless, the Sb—Te alloy sputtering target according to the present invention is extremely unique in that the eroded surface after sputtering has a surface roughness Ra of 0.5 µm or less.

With a target that has a uniform and fine crystal structure as described above, the surface ruggedness caused by the sputter erosion will decrease, and the generation of particles caused by re-deposition (reattachments) onto the target surface can be inhibited.

Further, refinement of the structure yields advantages in that it is possible to inhibit the in-plane and lot-to-lot compositional variability of the sputtered film, and the quality of the phase-change recording layer will become stable. Then, it will be possible to effectively inhibit the generation of particles, abnormal electrical discharge and generation of nodules during sputtering.

Moreover, with the Sb—Te sputtering target of the present invention, what is more important is that it is possible to increase the transverse rupture strength to 60 MPa or greater. By significantly improving the mechanical strength as described above, it is possible to effectively prevent the generation of cracks or fractures in the target.

Further, with the Sb—Te sputtering target of the present invention, it is possible to make the oxygen content 1500 ppm or less, preferably 1000 ppm or less, and more preferably 500 ppm or less. The reduction of oxygen enables the further reduction in the generation of particles and the generation of abnormal electrical discharge.

As the powder to be used in manufacturing the Sb—Te sputtering target of the present invention with fine crystal grains and high strength, it is possible to use powder with a specific surface area (BET) of 0.5 m$^2$/g or greater, and preferably 0.7 m$^2$/g or greater.

The Sb—Te sputtering target may include one or more elements selected from Ag, In, Ge, Ga, Ti, Au, Pt and Pd at 25 at % or less, and, for instance, this is effective in a sputtering target for a phase-change recording layer comprising an Ag—In—Sb—Te alloy or a Ge—Sb—Te alloy.

It should be understood that the incidental and additional requirements described above are not necessarily incorporated into the primary constituent features of the present invention. In other words, such incidental and additional requirements may be arbitrary adopted according to the required nature or usage of the target.

EXAMPLES

Examples of the present invention are now explained. Incidentally, these examples are merely illustrative, and the present invention shall in no way be limited thereby. In other words, the present invention shall include the various modes and modifications covered by the technical spirit of this invention. In addition, the following examples are described as preferable examples containing all conditions claimed herein so that the present invention can be easily understood and practiced. Nevertheless, the present invention does not require the inclusion of all of these conditions. In other words, it should be understood that an invention can be concluded even with only a part of the examples so as long as there is no known art.

Example 1

$Ge_{22.2}Sb_{22.2}Te_{55.6}$ (at %) alloy raw material was injected with a gas atomizer having a nozzle diameter 2.00 mm φ, argon gas as the injected gas, temperature of 780° C., and pressure of 50 kgf/cm$^3$ in order to manufacture atomized powder (atomized powder was manufactured under the same conditions in the following Examples and Comparative Examples).

This gas atomized powder was further introduced into a vibratory ball mill, which is machinery used for mechanical pulverization, and subject to mechanical pulverization with inert gas of Ar as the atmosphere gas without any atmospheric exposure. The machine pulverizing time was 30 minutes. The oxygen content after mechanical pulverization was 350 wtppm. Further, the maximum grain size was 39 μm, and homogenous granular powder was obtained.

The SEM photo (image) of the obtained powder is shown in FIG. 1. The scale of FIG. 1 is as indicated in the diagram. As shown in FIG. 1, clean globular powder was obtained. Incidentally, the amount of tabular particles was 6%.

Moreover, this machine-pulverized powder was hot pressed. As a result, the relative density became 100% and the transverse rupture strength became 70 MPa, and a sintered compact (target) with extremely high strength was obtained. No generation of cracks could be acknowledged.

Sputtering was performed using this target. The result was no generation of arcing, the average number of generated particles at around 10 kW/hr was 25, and the surface roughness Ra of the eroded surface after sputtering was 0.4 μm. The foregoing results are shown in Table 1. Incidentally, the following Examples are also shown in Table 1. Incidentally, in Table 1, GST represents the $Ge_{22.2}Sb_{22.2}Te_{55.6}$ (at %) alloy material, AIST represents the $Ag_5In_5Sb_{70}Te_{20}$ (at %) alloy material, and AIST-2 represents the $Ag_5In_{30}Sb_{60}Te_5$ (at %) alloy material.

Example 2

$Ge_{22.2}Sb_{22.2}Te_{55.6}$ (at %) alloy raw material was injected with a gas atomizer having a nozzle diameter 2.00 mm φ, argon gas as the injected gas, and temperature of 780° C. in order to manufacture atomized powder.

This gas atomized powder was further introduced into a vibratory ball mill, which is machinery used for mechanical pulverization, and subject to mechanical pulverization with inert gas of Ar as the atmosphere gas. Incidentally, the foregoing powder was exposed to the atmosphere during the refill. The machine pulverizing time was 30 minutes. The oxygen content after mechanical pulverization was 970 wtppm. Further, the maximum grain size was 43 μm, and homogenous granular powder was obtained. Incidentally, the amount of tabular particles was 6%.

Moreover, this machine-pulverized powder was hot pressed. As a result, the relative density became 100% and the transverse rupture strength became 68 MPa, and a sintered compact (target) with extremely high strength was obtained. No generation of cracks could be acknowledged.

Sputtering was performed using this target. The result was no generation of arcing, the average number of generated particles at around 10 kW/hr was 31, and the surface roughness Ra of the eroded surface after sputtering was 0.4 μm.

Example 3

$Ge_{22.2}Sb_{22.2}Te_{55.6}$ (at %) alloy raw material was injected with a gas atomizer having a nozzle diameter 2.00 mm φ, argon gas as the injected gas, and temperature of 780° C. in order to manufacture atomized powder.

This gas atomized powder was further introduced into a vibratory ball mill, which is machinery used for mechanical pulverization, and subject to mechanical pulverization with inert gas of Ar as the atmosphere gas. The machine pulverizing time was 10 minutes. The oxygen content after mechanical pulverization was 210 wtppm. Further, the maximum grain size was 85 μm, and homogenous granular powder was obtained. Incidentally, the amount of tabular particles was 2%

Moreover, this machine-pulverized powder was hot pressed. As a result, the relative density became 100% and the transverse rupture strength became 65 MPa, and a sintered compact (target) with extremely high strength was obtained. No generation of cracks could be acknowledged Sputtering was performed using this target. The result was no generation of arcing, the average number of generated

TABLE 1

| | Example | | | | |
|---|---|---|---|---|---|
| | 1 | 2 | 3 | 4 | 5 |
| Material | GST | GST | GST | GST | AIST |
| Vibrational Mill | 30 min. | 30 min. | 10 min. | 60 min. | 30 min. |
| Atmospheric Exposure | None | Exposure during refill | None | Exposure during refill | None |
| Max Particle Size after Pulverization | 39 μm | 43 μm | 85 μm | 31 μm | 31 μm |
| Tabular Particle Weight | 6% | 6% | 2% | 9% | 4% |
| Oxygen Concentration | 350 wtppm | 970 wtppm | 210 wtppm | 1400 wtppm | 120 wtppm |
| Relative Density | 100% | 100% | 100% | 100% | 98% |
| Transverse Rupture Strength | 70 MPa | 68 MPa | 65 MPa | 68 MPa | 72 MPa |
| Ave. Particle Count up to 10 kWh | 25 particles | 31 particles | 30 particles | 38 particles | 20 particles |
| Surface Roughness Ra | 0.4 μm | 0.4 μm | 0.5 μm | 0.4 μm | 0.3 μm | particles at around 10 kW/hr was 30, and the surface roughness Ra of the eroded surface after sputtering was 0.5 μm.

Example 4

$Ge_{22.2}Sb_{22.2}Te_{55.6}$ (at %) alloy raw material was injected with a gas atomizer having a nozzle diameter 2.00 mm φ, argon gas as the injected gas, and temperature of 780° C. in order to manufacture atomized powder.

This gas atomized powder was further introduced into a vibratory ball mill, which is machinery used for mechanical pulverization, and subject to mechanical pulverization with inert gas of Ar as the atmosphere gas. The machine pulverizing time was 60 minutes. Incidentally, the foregoing powder was exposed to the atmosphere during the refill. The oxygen content after mechanical pulverization was 1400 wtppm. Further, the maximum grain size was 31 μm, and homogenous granular powder was obtained. Incidentally, the amount of tabular particles was 9%.

Moreover, this machine-pulverized powder was hot pressed. As a result, the relative density became 100% and the transverse rupture strength became 68 MPa, and a sintered compact (target) with extremely high strength was obtained. No generation of cracks could be acknowledged.

Sputtering was performed using this target. The result was no generation of arcing, the average number of generated particles at around 10 kW/hr was 38, and the surface roughness Ra of the eroded surface after sputtering was 0.4 μm.

Example 5

$Ag_5In_5Sb_{70}Te_{20}$ (at %) alloy raw material was injected with a gas atomizer having a nozzle diameter 2.00 mm φ, argon gas as the injected gas, and temperature of 514° C. in order to manufacture atomized powder.

This gas atomized powder was further introduced into a vibratory ball mill, which is machinery used for mechanical pulverization, and subject to mechanical pulverization with inert gas of Ar as the atmosphere gas without any atmospheric exposure. The machine pulverizing time was 30 minutes. The oxygen content after mechanical pulverization was 120 wtppm. Further, the maximum grain size was 31 μm, and homogenous granular powder was obtained.

Moreover, this machine-pulverized powder was hot pressed. As a result, the relative density became 98% and the transverse rupture strength became 72.0 MPa, and a sintered compact (target) with extremely high strength was obtained. No generation of cracks could be acknowledged.

Sputtering was performed using this target. The result was no generation of arcing, the average number of generated particles at around 10 kW/hr was 20, and the surface roughness Ra of the eroded surface after sputtering was 0.3 μm.

Comparative Example 1

$Ge_{22.2}Sb_{22.2}Te_{55.6}$ (at %) alloy raw material was injected with a gas atomizer having a nozzle diameter 2.00 mm φ, argon gas as the injected gas, and temperature of 780° C. in order to manufacture atomized powder.

This gas atomized powder was further introduced into a vibratory ball mill, which is machinery used for mechanical pulverization, and subject to mechanical pulverization with inert gas of Ar as the atmosphere gas. The machine pulverizing time was 5 minutes. The oxygen content after mechanical pulverization was 300 wtppm. Further, the maximum grain size was 300 μm, and enlarged significantly. Incidentally, the amount of tabular particles was 2%.

Moreover, this machine-pulverized powder was hot pressed. As a result, the relative density became 97% and the transverse rupture strength became 50 MPa, and a sintered compact (target) with low transverse rupture strength was obtained. Generation of cracks was acknowledged.

Sputtering was performed using this target. The result was generation of arcing, and the average number of generated particles at around 10 kW/hr increased to 61. Further, the surface roughness Ra of the eroded surface after sputtering was inferior at 0.6 μm. The foregoing results are shown in Table 2. Incidentally, the following Comparative Examples are also shown in Table 2. Incidentally, in Table 2, GST represents the $Ge_{22.2}Sb_{22.2}Te_{55.6}$ (at %) alloy material, and AIST represents the $Ag_5In_5Sb_{70}Te_{20}$ (at %) alloy material.

TABLE 2

| | Comparative Example | | | | |
|---|---|---|---|---|---|
| | 1 | 2 | 3 | 4 | 5 |
| Material | GST | GST | GST | AIST | AIST-2 |
| Vibrational Mill | 5 min. | 12 hrs. | 30 min. | 30 min. | 30 min. |
| Atmospheric Exposure | None | None | Atmospheric pulverization | Atmospheric pulverization | None |
| Max Particle Size after Pulverization | 300 μm | >2000 μm | 35 μm | 31 μm | 97 μm |
| Tabular Particle Weight | 2% | 40% | 8% | 4% | 25% |
| Oxygen Concentration | 300 wtppm | 490 wtppm | 2700 wtppm | 1900 wtppm | 110 wtppm |
| Relative Density | 97% | 96% | 100% | 98% | 98% |
| Transverse Rupture Strength | 50 MPa | 52 MPa | 67 MPa | 70 MPa | 75 MPa |
| Ave. Particle Count up to 10 kWh | 61 particles | 150 particles | 80 particles | 55 particles | 40 particles |
| Surface Roughness Ra | 0.6 μm | 1.1 μm | 0.5 μm | 0.3 μm | 0.6 μm |

Comparative Example 2

$Ge_{22.2}Sb_{22.2}Te_{55.6}$ (at %) alloy raw material was injected with a gas atomizer having a nozzle diameter 2.00 mm φ, argon gas as the injected gas, and temperature of 780° C. in order to manufacture atomized powder.

This gas atomized powder was further introduced into a vibratory ball mill, which is machinery used for mechanical pulverization, and subject to mechanical pulverization with inert gas of Ar as the atmosphere gas. The machine pulverizing time was 12 hours. The oxygen content after mechanical pulverization was 490 wtppm. Further, the maximum grain size exceeded 2000 μm, and enlarged abnormally. Incidentally, the amount of tabular particles increased significantly to 40%.

Moreover, this machine-pulverized powder was hot pressed. As a result, the relative density became 96% and the transverse rupture strength became 52 MPa, and a sintered compact (target) with low transverse rupture strength was obtained. Generation of cracks was acknowledged.

Sputtering was performed using this target. The result was generation of arcing, and the average number of generated particles at around 10 kW/hr increased significantly to 150. Further, the surface roughness Ra of the eroded surface after sputtering was inferior at 1.1 µm.

Comparative Example 3

$Ge_{22.2}Sb_{22.2}Te_{55.6}$ (at %) alloy raw material was injected with a gas atomizer having a nozzle diameter 2.00 mm φ, argon gas as the injected gas, and temperature of 780° C. in order to manufacture atomized powder.

This gas atomized powder was further introduced into a vibratory ball mill, which is machinery used for mechanical pulverization, and subject to mechanical pulverization in the atmosphere. The machine pulverizing time was 30 minutes. The oxygen content after mechanical pulverization was 2700 wtppm, and increased significantly. Further, the maximum grain size was 35 µm. Incidentally, the amount of tabular particles was 8%.

Moreover, this machine-pulverized powder was hot pressed. As a result, a sintered compact (target) having a relative density of 100% and a transverse rupture strength of 67 MPa was obtained. Generation of cracks could not be acknowledged.

Sputtering was performed using this target. The result was generation of arcing, and the average number of generated particles at around 10 kW/hr increased to 80. Further, the surface roughness Ra of the eroded surface after sputtering was 0.5 µm.

Comparative Example 4

$Ag_5In_5Sb_{70}Te_{20}$ (at %) alloy raw material was injected with a gas atomizer having a nozzle diameter 2.00 mm φ, argon gas as the injected gas, and temperature of 780° C. in order to manufacture atomized powder.

This gas atomized powder was further introduced into a vibratory ball mill, which is machinery used for mechanical pulverization, and subject to mechanical pulverization in atmosphere. The machine pulverizing time was 30 minutes. The oxygen content after mechanical pulverization was 1900 wtppm, and increased significantly. Further, the maximum grain size was 31 µm. Incidentally, the amount of tabular particles was 4%.

Moreover, this machine-pulverized powder was hot pressed. As a result, a sintered compact (target) having a relative density of 98% and a transverse rupture strength of 70 MPa was obtained. Generation of cracks could not be acknowledged.

Sputtering was performed using this target. The result was generation of arcing, and the average number of generated particles at around 10 kW/hr increased to 55. Further, the surface roughness Ra of the eroded surface after sputtering was 0.3 µm.

Comparative Example 5

$Ag_5In_{30}Sb_{60}Te_5$ (at %) alloy raw material was injected with a gas atomizer having a nozzle diameter 2.00 mm φ, argon gas as the injected gas, and temperature of 780° C. in order to manufacture atomized powder.

This gas atomized powder was further introduced into a vibratory ball mill, which is machinery used for mechanical pulverization, and subject to mechanical pulverization with inert gas of Ar as the atmosphere gas. The machine pulverizing time was 30 minutes. The oxygen content after mechanical pulverization was 110 wtppm. Further, the maximum grain size was 97 µm, and enlarged slightly. Incidentally, the amount of tabular particles was large at 25%.

Moreover, this machine-pulverized powder was hot pressed. As a result, the relative density became 98% and the transverse rupture strength became 75 MPa, and a sintered compact (target) with high transverse rupture strength was obtained. Generation of cracks could not be acknowledged.

Sputtering was performed using this target. The result was generation of arcing, and the average number of generated particles at around 10 kW/hr increased to 40. Further, the surface roughness Ra of the eroded surface after sputtering was inferior at 0.6 µm. The foregoing results are shown in Table 2.

As shown in Comparative Examples 1 and 2, when the diameter of the pulverized particles is large, the transverse rupture strength of the target will decrease, cracks are generated in the target, and particles will increase. Further, as shown in Comparative Examples 3 and 4, the amount of oxygen increased significantly and the particles also increased with atmospheric pulverization. Moreover, as shown in Comparative Example 5, when one or more elements among Ag, In, Ge, Ga, Ti, Au, Pt and Pd exceed 25 at %, the maximum diameter of the crushed particles becomes large, and as a result the surface roughness Ra of the eroded surface will increase and the particles will increase.

Meanwhile, with the Sb—Te sputtering target sintered compact of the present invention, the maximum grain size of the powder obtained by additionally subjecting gas atomized powder of an Sb—Te alloy to mechanical pulverization was 90 µm or less, the oxygen content was 1500 ppm or less, the transverse rupture strength was 65 MPa or greater, and the surface roughness Ra of the eroded surface after sputtering was 0.5 µm or less. Thereby, it has been confirmed that a superior target could be obtained without any generation of cracks in the target, and with a significant decrease in the number of particles.

As described above, as a result of using powder of the present invention, a superior effect is yielded in that the Sb—Te alloy sputtering target structure becomes uniform and refined, generation of cracks in the sintered target is prevented, and generation of arcing during sputtering is inhibited. Further, an additional effect is yielded in that the surface ruggedness caused by sputter erosion is reduced, and generation of particles caused by re-deposition peeling onto the target surface is reduced. Moreover, by refining and homogenizing the target structure, it is possible to inhibit the in-plane and lot-to-lot compositional variability of the manufactured thin film, and the quality of the phase-change recording layer will become stable. Further, it is possible to reduce the generation of nodules caused by the difference in the sputtering rate, and consequently inhibit the generation of particles.

Accordingly, the present invention is extremely useful in manufacturing Sb—Te alloy powder for sintering, in particular an Sb—Te alloy sputtering target for forming a phase-change recording layer comprising an Ag—In—Sb—Te alloy or an Ge—Sb—Te alloy, an Sb—Te alloy powder for sintering to be used in the foregoing manufacture, and as the manufacturing method of such Sb—Te alloy powder for sintering.

The invention claimed is:

1. Sb—Te alloy powder for sintering, wherein the maximum grain size of the powder excluding tabular coarse particles obtained by additionally subjecting gas atomized powder of an Sb—Te alloy to mechanical pulverization is 90 μm or less, and the amount of tabular particles formed by adhesion, compression or rolling with a pulverization jig upon the mechanical pulverization of powder is 2 wt % or greater and 10 wt % or less of the overall amount of the powder.

2. The Sb—Te alloy powder for sintering according to claim 1, wherein the oxygen concentration after mechanical pulverization is 1500 wtppm or less.

3. The Sb—Te alloy powder for sintering according to claim 1, wherein the oxygen concentration after mechanical pulverization is 1000 wtppm or less.

4. The Sb—Te alloy powder for sintering according to claim 1, wherein the oxygen concentration after mechanical pulverization is 500 wtppm or less.

5. The Sb—Te alloy powder for sintering according to claim 4, wherein the powder contains one or more elements selected from Ag, In, Ge, Ga, Ti, Au, Pt and Pd at 25 at % or less.

6. The Sb—Te alloy powder for sintering according to claim 1, wherein the powder contains one or more elements selected from Ag, In, Ge, Ga, Ti, Au, Pt and Pd at 25 at % or less.

7. A method of manufacturing Sb—Te alloy powder for a sintered compact sputtering target, comprising the steps of:
dissolving an Sb—Te alloy;
subjecting the dissolved alloy to gas atomization to obtain atomized powder; and
subjecting the atomized powder to mechanical pulverization in an inert atmosphere without any atmospheric exposure;
wherein a maximum grain size of the powder excluding tabular coarse particles obtained by said step of subjecting the atomized powder to mechanical pulverization is 90 μm or less; and
wherein an amount of tabular particles formed by adhesion, compression or rolling with a pulverization jig upon the mechanical pulverization of powder is 2 wt % or greater and 10 wt % or less of the overall amount of the powder.

8. A method according to claim 7, wherein oxygen concentration of the powder after mechanical pulverization is 1500 wtppm or less.

9. A method according to claim 7, wherein oxygen concentration of the powder after mechanical pulverization is 500 wtppm or less.

10. A method according to claim 9, wherein the powder contains one or more elements selected from Ag, In, Ge, Ga, Ti, Au, Pt and Pd at 25 at % or less.

11. A method according to claim 7, wherein the powder contains one or more elements selected from Ag, In, Ge, Ga, Ti, Au, Pt and Pd at 25 at % or less.

12. A sintered compact sputtering target obtained by sintering Sb—Te alloy powder, wherein the maximum grain size of the powder excluding tabular coarse particles obtained by additionally subjecting gas atomized powder of an Sb—Te alloy to mechanical pulverization is 90 μm or less, and the amount of tabular particles formed by adhesion, compression or rolling with a pulverization jig upon the mechanical pulverization of powder is 2 wt % or greater and 10 wt % or less of the overall amount of the powder.

13. A sintered compact sputtering target according to claim 12, wherein a surface roughness Ra of an eroded surface after sputtering using said Sb—Te alloy sintered compact sputtering target is 0.5 μm or less.

14. A sintered compact sputtering target according to claim 12, wherein oxygen concentration within the target is 1500 wtppm or less.

15. A sintered compact sputtering target according to claim 12, wherein oxygen concentration within the target is 1000 wtppm or less.

16. A sintered compact sputtering target according to claim 12, wherein oxygen concentration within the target is 500 wtppm or less.

17. A sintered compact sputtering target according to claim 16, wherein a surface roughness Ra of an eroded surface after sputtering using said Sb—Te alloy sintered compact sputtering target is 0.5 μm or less.

18. A sintered compact sputtering target according to claim 16, wherein the target contains one or more elements selected from Ag, In, Ge, Ga, Ti, Au, Pt and Pd at 25 at % or less.

19. A sintered compact sputtering target according to claim 18, wherein a surface roughness Ra of an eroded surface after sputtering using said Sb—Te alloy sintered compact sputtering target is 0.5 μm or less.

20. A sintered compact sputtering target according to claim 12, wherein the target contains one or more elements selected from Ag, In, Ge, Ga, Ti, Au, Pt and Pd at 25 at % or less.

* * * * *